United States Patent
Lai et al.

(10) Patent No.: US 11,680,978 B2
(45) Date of Patent: Jun. 20, 2023

(54) GAN RELIABILITY BUILT-IN SELF TEST (BIST) APPARATUS AND METHOD FOR QUALIFYING DYNAMIC ON-STATE RESISTANCE DEGRADATION

(71) Applicant: Taiwan Semiconductor Manufacturing Co., Ltd., Hsin-Chu (TW)

(72) Inventors: Yu-Ann Lai, Hsin-Chu (TW); Ruo-Rung Huang, Hsin-Chu (TW); Kun-Lung Chen, Chu Pei (TW); Chun-Yi Yang, Hsinchu (TW); Chan-Hong Chern, Palo Alto, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 318 days.

(21) Appl. No.: 17/039,627

(22) Filed: Sep. 30, 2020

(65) Prior Publication Data

US 2022/0099726 A1    Mar. 31, 2022

(51) Int. Cl.
*G01R 31/26* (2020.01)
*H03K 17/687* (2006.01)
*G01R 31/27* (2006.01)
*H03K 3/017* (2006.01)

(52) U.S. Cl.
CPC ......... *G01R 31/2621* (2013.01); *G01R 31/27* (2013.01); *H03K 3/017* (2013.01); *H03K 17/6871* (2013.01); *H03K 2217/0063* (2013.01); *H03K 2217/0072* (2013.01)

(58) Field of Classification Search
CPC .... G01R 31/2621; G01R 31/27; H03K 3/017; H03K 17/6871; H03K 2217/0063; H03K 2217/0072
See application file for complete search history.

(56) References Cited

U.S. PATENT DOCUMENTS

| | | | | |
|---|---|---|---|---|
| 5,055,715 | A * | 10/1991 | Inaba ................. | G01R 31/3004 714/724 |
| 6,377,131 | B1 * | 4/2002 | Langer ................. | H02M 3/145 332/109 |
| 2013/0088480 | A1 * | 4/2013 | Hong ................... | G09G 3/3677 345/212 |
| 2013/0241621 | A1 * | 9/2013 | Forghani-Zadeh ......................... | H03K 17/08122 327/315 |

(Continued)

FOREIGN PATENT DOCUMENTS

JP     2007035171 A  *  2/2007

*Primary Examiner* — Metasebia T Retebo
(74) *Attorney, Agent, or Firm* — Duane Morris LLP

(57) ABSTRACT

An apparatus and method for testing gallium nitride field effect transistors (GaN FETs) are disclosed herein. In some embodiments, the apparatus includes: a high side GaN FET, a low side GaN FET, a high side driver coupled to a gate of the high side GaN FET, a low side driver coupled to a gate of the low side GaN FET, and a driver circuit coupled to the high side and low side drivers and configured to generate drive signals capable of driving the high and low side GaN FETs, wherein the high and low side GaN FETs and transistors, within the high and low side drivers and the driver circuit, are patterned on a same semiconductor device layer during a front-end-of-line (FEOL) process.

20 Claims, 5 Drawing Sheets

(56) References Cited

U.S. PATENT DOCUMENTS

2016/0025805 A1\* 1/2016 Uppal ................ H01L 23/5256
  438/18
2021/0382094 A1\* 12/2021 You ..................... G01R 19/257

\* cited by examiner

GAN RELIABILITY BUILT-IN SELF TEST (BIST) APPARATUS AND METHOD FOR QUALIFYING DYNAMIC ON-STATE RESISTANCE DEGRADATION

BACKGROUND

Gallium Nitride (GaN) semiconductor technology may be used as a fabrication material for fabrication of high power field effect transistors (FETs) that exhibit a lower gate capacitance ($C_g$) and gate charge ($Q_g$) compared to the state-of-the-art silicon FETs, such as metal oxide semiconductor FETs (MOSFETs). Another advantage of GaN FET is that GaN semiconductor technology provides a strain induced piezo-electric charge that allows conduction channels (e.g., two-dimensional electron gas (2DEG) region) to be formed within the GaN based semiconductor device without the need for doping. As such, eliminating the need for doping the GaN FET may reduce the impurity scattering effect of the semiconductor device and allow intrinsic mobile carriers to form in a current conducting channel (e.g., 2DEG region) resulting in a low on-resistance ($R_{DSON}$).

Currently, GaN FETs can perform four to five times better than a MOSFET (e.g., switching speeds can be ¼ to ⅕ that of silicon FETs), and it is believed that GaN FETs can perform potentially 100s of times better than MOSFETs. For example, GaN based FETs can be switched at a much higher switching frequency than MOSFETs with an equivalent power loss. This means that GaN based FETs can achieve a higher power efficiency in power circuits compared to MOSFETs without a change in operation frequency.

However, GaN based FETs may contain mobile carrier traps that, due to a potentially large band gap associated with GaN FETs, may trap or pull and retain mobile carriers within the GaN. These traps may lead to an adverse effect associated with GaN based semiconductor devices known as current collapse which may result in a decrease in the quantity of mobile carriers in the current conducting channel. Moreover, GaN FETs may rely on a combination of a GaN substrate and a common substrate (e.g., a Silicon (Si) substrate, a Silicon-Carbide (SiC) substrate, or other similar type of substrate made from a material that exhibits similar electrical and chemical properties as Si or SiC) to improve performance of the semiconductor device over other types of semiconductor devices without increasing cost. In GaN based semiconductor devices, the Si based substrate may induce many crystal defects (e.g. vacancies, edge dislocation, screw dislocation, and/or misfit dislocations) due to different lattice constants of the GaN and Si substrates. Furthermore, GaN based semiconductor devices that rely on a combination of a GaN substrate and a common substrate may suffer from an abnormally high rate of traps which may result in the GaN based semiconductor device to be ineffective and unusable. For example, current collapse in a GaN based semiconductor device, due to electron trapping effects, may increase $R_{DSON}$ of the GaN based semiconductor device by a factor of 100, and in effect, render the GaN semiconductor device useless for most applications.

The above described defects cannot be easily detected by chip level or package level functionality tests. As a result of the failure to detect device defects, some devices that are shipped to customers may have a potential reliability issue over an expected operational lifetime. Therefore, reliability tests may be used to evaluate potential reliability issues over the operational lifetime of a device and guarantee the reliability of a device within the warranty period by using accelerated conditions to simulate the operating life over a shortened test period. GaN based FET devices (e.g. High-Electron Mobility Transistors (HEMTs) and Light-Emitting Devices (LEDs)) have been a particular subject of reliability studies in recent years. The High Temperature Operation Life (HTOL) test is one such reliability test that requires the application of a high temperature and voltage stress on the semiconductor devices over long periods, for a small sample size, to evaluate the lifetime and failure rate of the larger population. By operating GaN FET devices at an accelerated temperature and voltage, hundreds of thousands of use hours may be compressed into hundreds of test hours.

However, conventional HTOL testing methods requires package level GaN devices mounted on an evaluation board. Moreover, the conventional HTOL testing methods may need very long assembly time (e.g., longer than 4 weeks). Furthermore, HTOL Dynamic-Rdson testing results may also be affected by bonding and package processes. Additionally, conventional HTOL testing methods are unable to identify each wafer's performance. Therefore, current HTOL testing methods of GaN devices are not entirely satisfactory.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
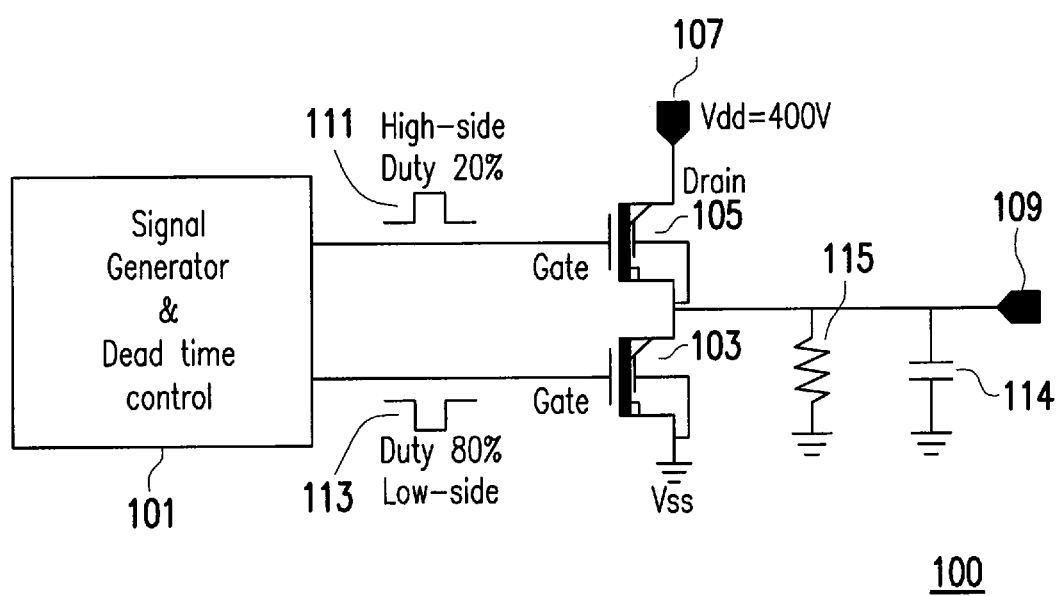
FIG. 1 illustrates an example of a built-in self-test circuit formed on a testing printed circuit board (PCB) for a power amplification stage that employs low side and high side GaN FETs, in accordance with some embodiments of the present disclosure.

FIG. 1 illustrates an example of a built-in self-test circuit 100 formed on a testing printed circuit board (PCB) for a power amplification stage that employs low side and high side GaN FETs, in accordance with some embodiments. In some embodiments, the built-in self-test circuit for HTOL testing may include low and high side GaN bidirectional switches 103 and 105, respectively. In one embodiment, as shown in FIG. 1, the low and high side GaN bidirectional switches 103 and 105 are stacked with a drain of the low side GaN FET coupled to a source of the high side GaN FET. In some embodiments, a gate of the low side GaN is referenced to ground and a gate of the high side GaN FET is referenced to a floating voltage at the drain of the low side GaN FET. In the example circuit shown in FIG. 1, the GaN bidirectional switches 103 and 105 are driven by driver signals 111 and 113 generated by a driver circuit 101. In some embodiments, the GaN bidirectional switches 103 and 105 may be on separate GaN substrates and separate common substrates. In other embodiments, the GaN bidirectional switches 103 and 105 may be on separate GaN substrates, but on a single common substrate. As shown in FIG. 1, a drain of the GaN switch 105 is coupled to a voltage source VDD 107 and a source of the GaN switch 103 is coupled to a ground GND. In some embodiments the voltage source VDD may be set to a voltage in a range of 350 volts (V) to 450 V. For example, in some embodiments, VDD 107 may provide 400 V.

The driver circuit 101 provides the drive signals 111 and 113, which are suitable for driving gates of the GaN bidirectional switches 103 and 105 and causing the bidirectional switches 103 and 105 to turn-on and/or turn-off. In some embodiments, the drive signal 111 may have a first duty cycle configured by the driver circuit 101. In various embodiments, the drive signal 111 may have a duty cycle (i.e., the ratio of the length of time that the signal is high compared to that when it is low) in the range of 70% to 85% (e.g., 80%). In some embodiments, the drive signal 113 may have a second duty cycle configured by the driver circuit 101. In various embodiments, the drive signal 113 may have a duty cycle in the range of 15% to 30% (e.g., 20%). In some embodiments, the duty cycles of the first drive signal 111 and the second drive signal 113 are complementary to each other such that their sum is equal to 100% and only one of the GaN switches 103 and 105 are turned on at a time. Moreover, the driver circuit 101 may be configured to set the duty cycle of the drive signals 111 and 113 based on operational parameters of a device under test (DUT), as discussed in further detail below. In some embodiments, the driver circuit 101 may include a signal generator and one or more dead time control circuits configured to generate pulse width modulated (PWM) drive signals 111 and 113 with predetermined duty cycles. As shown in FIG. 1, the built-in self-test circuit 100 may include a resistor 115 having a first end coupled to the drain of the GaN switch 103 and the source of the GaN switch 105 and a second end coupled to ground. Furthermore, the built-in self-test circuit 100 may also include a capacitor 114 having a first end coupled to the drain of the GaN switch 103 and the source of the GaN switch 105 and a second end coupled to ground. In some embodiments, the resistor 115 and the capacitor 114 may filter a high frequency measurement noise. Additionally, the built-in self-test circuit 100 may include a voltage probe 109 configured to measure the dynamic on-state resistance ($R_{d\text{-}son}$) of each of GaN switches 103 and 105. As such, the voltage probe 109 may be configured to measure the voltage across the resistor 115, which may be used to determine the on-state resistances of the GaN bidirectional switches 103 and 105. In some embodiments, the probe 109 may be a high-voltage differential probe.

Figure 2A:
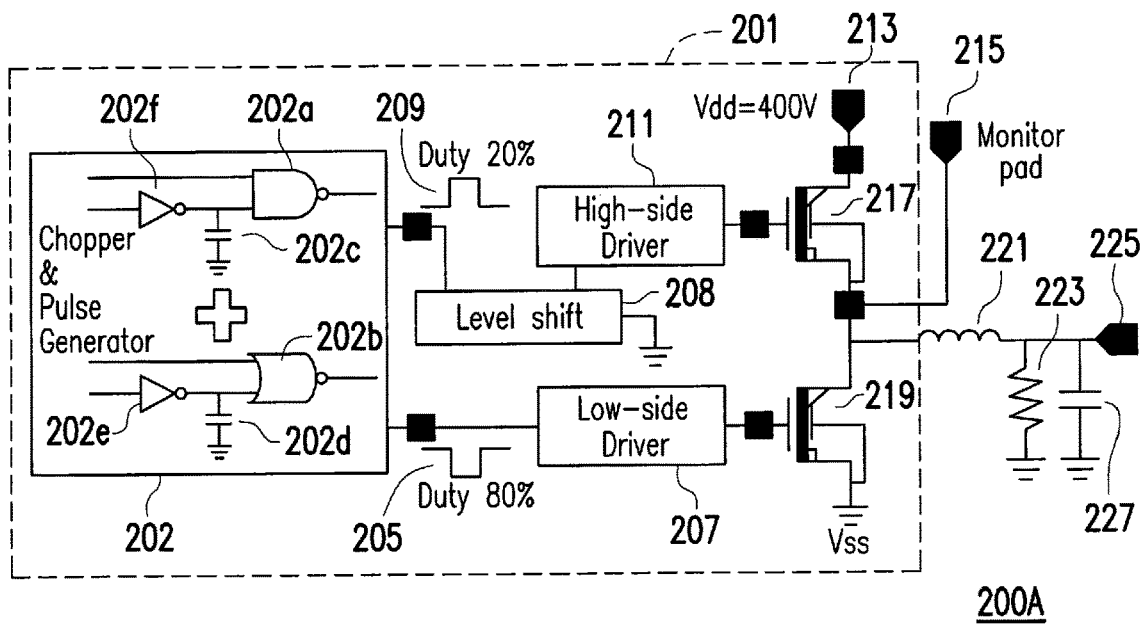
FIG. 2A illustrates an example of a built-in self-test circuit formed on a semiconductor wafer for a power amplification stage that employs low side and high side GaN FETs, in accordance with some embodiments of the present disclosure.

FIG. 2A illustrates an example of a built-in self-test circuit 200A formed on a semiconductor wafer for a power amplification stage that employs both low side and high side GaN FETs. In some embodiments, the built-in self-test circuit 200A formed on a semiconductor wafer 201 includes GaN bidirectional switches 219 and 217. In various embodiments of the present disclosure, the built-in self-test circuit 200A may include a voltage level shifter (VLS) 208 coupled to an input of a high side driver 211. In some embodiments, the level shifter 208 is used to provide a proper bias point for the GaN switch 217. In addition, an output of the high-side driver 211 may be coupled to a gate of a high-side GaN FET switch 217. The built-in self-test circuit 200A may also include a low side driver 207 coupled to a gate of the low-side GaN FET switch 219. In some embodiments, a high voltage rail of the high-side driver 211 may be coupled to VDD through a high voltage diode and a low voltage rail of the low-side driver 207 may be coupled to GND. In operation, the high-side and low-side drivers 207 and 211 are controlling the GaN FET switches 219 and 217, respectively such that an output signal produced by the drivers 207 and 211 may cause the GaN FET switches 219 and 217 to transition from operating between an on-state and an off-state.

In various embodiments, the built-in self-test circuit 200A may include a driver circuit 202 configured to provide drive signals 209 and 205, which are input to the high-side and low-side drivers 211 and 207, respectively. In some embodiments, the drive signal 209 may have a first duty cycle configured by the driver circuit 202. In various embodiments, the first duty cycle may be in a range of 15%-30%. For example, the first duty cycle of the drive signal 209 may be 20%. In some embodiments, the drive signal 205 may have a second duty cycle configured by the driver circuit 202. In various embodiments, the second duty cycle may be in a range of 70-85%. For example, the second duty cycle of the drive signal 205 may be 80%. Moreover, the driver circuit 202 may be configured to set the duty cycle of the drive signals 209 and 205 based on programmable parameters. In some embodiments, the driver circuit 202 may include a chopper and a pulse generator circuits configured to generate pulse width modulated (PWM) drive signals 209 and 205 with programmable duty cycles.

In various embodiments, the driver circuit 202 may include a chopper and pulse generator circuit configured to provide signals with various duty cycles. As shown FIG. 2A, in some embodiments, the chopper circuit includes a NAND gate 202a having a first input coupled to receive a timing reference signal (e.g., a square wave with 50% duty cycle) from a clock generator (not shown). A second input of the NAND gate 202a is coupled to an output of one or more inverters 202f, which has an input coupled to receive the above mentioned timing reference signal from the same clock generator. The second input of the NAND gate 202a is further coupled to a first end of a first capacitor 202c having a second end coupled to ground. In some embodiments, the first capacitor 202c may be used to filter a high frequency noise generated by the clock generator. The output of the NAND gate 202a is a PWM drive signal having a desired duty cycle, which is subsequently used to generate drive signal 209. Furthermore, as illustrated in FIG. 2A, the pulse generator circuit may be configured to provide pulse signals with various duty cycles or widths. The pulse generator may include a NOR gate 202b having a first input coupled to receive the timing reference signal from the clock generator. A second input of the NOR gate 202b is coupled to an output of one or more inverters 202e, which has an input coupled to receive the timing reference signal from the clock generator. The second input of the NOR gate 202b is further coupled to a first end of a second capacitor 202d having a second end coupled to ground. In some embodiments, the second capacitor 202d may be used to filter a high frequency noise generated by the clock generator. The output of the NOR gate 202b is a pulse signal having a desired duty cycle or pulse width, which is subsequently used to generate drive signal 205.

In further embodiments, transistors and the capacitors within the driver circuit 202 as well as transistors within the low and high side drivers 207 and 211 and the GaN FET switches 217 and 219 may be patterned on the same semiconductor device layer during the front-end-of-line (FEOL) process. During the FEOL process, transistors, capacitors, resistors and other devices may be patterned on a semiconductor wafer before forming a metallization layer that is used to interconnect the transistors, capacitors, resistors and other devices patterned during the FEOL process. Furthermore, interconnections coupling the driver circuit 202 to the low and high side drivers 207 and 211 and, subsequently, the low and high side drivers 207 and 211 to the GaN FET switches 217 and 219 may be patterned on the same metallization layer during the back-end-of-line (BEOL) process.

In some embodiments, the duty cycle and frequency of the pulses generated by the chopper and pulse generator circuit can be designed based on HTOL testing requirements or any application-relevant device reliability specification. For example, the duty cycles and frequencies of the generated pulses may be set depending on the power requirements and/or predicted operational lifetime of the GaN based devices. In other embodiments, the driver circuit 202 may also provide non-overlapping high-side and low-side pulses with a programmable dead-time control.

As shown in FIG. 2A, a drain of the GaN switch 217 is coupled to a drain reference voltage VDD 213 and a source of the GaN switch 219 may be coupled to a source reference voltage VSS. In some embodiments, the drain reference voltage VDD may be set to about 400V and the source reference voltage VSS may be set to ground GND. In some approaches, VSS and GND are connected to minimize switching noise effects.

Additionally, the built-in self-test circuit 200A may include a plurality of monitoring pads. For example, a first voltage probe 215 may be configured to measure the dynamic on-state resistance ($R_{dson}$). In some embodiments, the first voltage probe 215 may be configured to measure drain to source voltages of the low side and high side GaN FETs 217 and 219. As another example, a second voltage probe may be configured to measure the voltage drop across a load resistor 223 coupled between the drain of the GaN FET switch 219 and ground, for example. In some embodiments, the voltage measurement across the load resistor 223 may be used to determine the dynamic on-state resistances of the GaN FETs 217 and 219. In other embodiments, the plurality of monitoring pads may be installed at the gate, source, and drain of the GaN FET switch 217. Moreover, an LC filter, comprising an inductor 221 connected to a capacitor 227, may be arranged between the GaN FETs 217 and 219 and the second monitoring pad 225. As such, the LC filter may be used to suppress high frequency noise. In other embodiments, one or more monitoring pads may be installed at inputs of the high-side and low-side drivers 211 and 207, respectively. One exemplary advantage of the built-in self-test circuit 200A is that it allows for on-wafer monitoring of the dynamic $R_{dson}$ degradation, which reduces the cycle time of the HTOL testing of GaN FET devices with epitaxial layers.

In some embodiments, the built-in self-test circuit 200A may be implemented on a chip. One exemplary advantage of the on chip implemented built-in self-test circuit 200A is that it allows monitoring of the dynamic $R_{dson}$ degradation on each die of a semiconductor wafer. Another exemplary advantage of the on chip implemented built-in self-test circuit 200A is that it provides a low cost and in-situ GaN wafer quality testing. The on chip implemented built-in self-test circuit 200A also provides an accelerated monitoring of dynamic $R_{dson}$ degradation. For example, the built-in self-test circuit 200A may reduce testing cycle time from 4 weeks to 1 day without sacrificing any wafers.

Additionally, the built-in self-test circuit 200A may be configured to sense a relationship between the GaN FET junction temperature and the dynamic on-state resistance ($R_{dson}$). For example, a subset of monitoring pads from the plurality of monitoring pads may be configured to measure temperatures of the GaN FETs 217 and 219. As such, the temperature measurements may be used to construct the relationship between the GaN FETs 217 and 219 junction temperatures and their dynamic on-state resistances ($R_{dson}$). In this respect, sensing the relationship between the GaN FET junction temperature and the dynamic on-state resistance ($R_{dson}$) may allow for lifetime prediction studies of GaN FET devices.

Figure 2B:
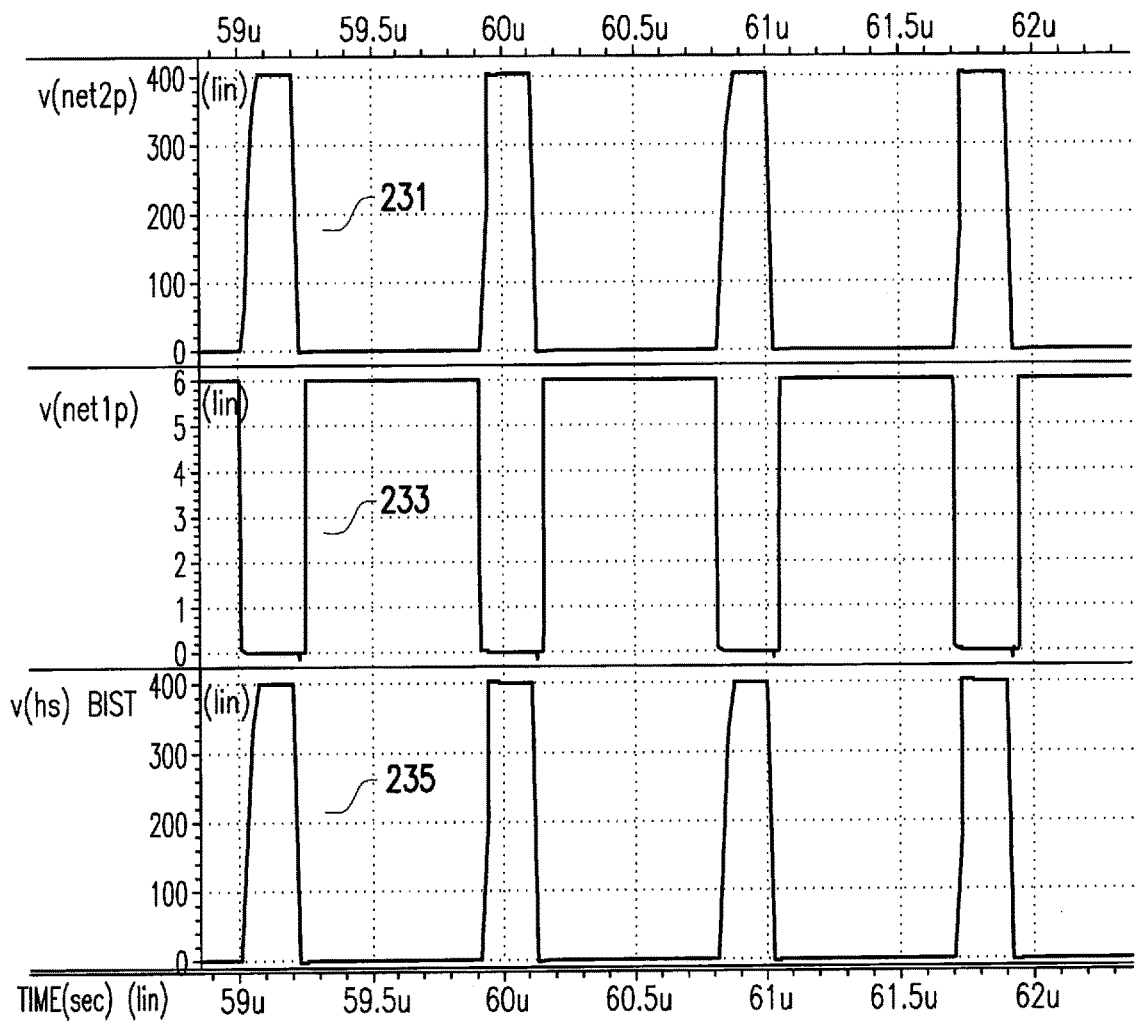
FIG. 2B illustrates a timing diagram showing operating conditions of the built-in self-test circuit of FIG. 2A, in accordance with some embodiments.

FIG. 2B illustrates a timing diagram showing operating conditions of the built-in self-test circuit of FIG. 2A, in accordance with some embodiments. As such, pulse width modulated waveforms 231 and 233 may be provided to the gates of the high and low side GaN FETs 217 and 219, respectively. In some embodiments, the duty cycle of the pulse width modulated waveforms 231 and 233 may be determined based on the operational parameters of a device to be reliability tested. For example, a device with GaN FETs requiring a high frequency switching operation may be tested with PWM waveforms having up to 60 MHz frequency and a duty cycle in a range of 20-80%. As another example, a device with GaN FETs requiring high power switching operation may be tested with PWM waveforms having large duty cycles. Moreover, the operational parameters may be determined based on High-Temperature Operating Life (HTOL) testing requirements. As such, the duty cycle of the pulse width modulated waveforms 231 and 233 may be designed based on HTOL stress test parameters such as an elevated temperature, a high voltage, and/or a dynamic operation for a predefined period of time. As shown in FIG. 2B, the PWM waveforms 231 and 233 are complementary to one another such that when one waveform is in a high state the other is in a low state. In this way, the GaN FETs 217 and 219 will not turn on at the same time. Moreover, an output waveform 235 can be observed at the first 215 or second 225 monitoring pads. As shown in FIG. 2B, the voltage of the waveform 235 may reach VDD (e.g., 400 V) at its peaks. In some embodiments, the output waveform 235 indicates switching characteristics of the high side GaN FET 217. For example, rail to rail (e.g., 0V to 400V) output swing indicates that the high side GaN FET 217 exhibits low dynamic on-state resistance ($R_{dson}$).

Figure 3A:
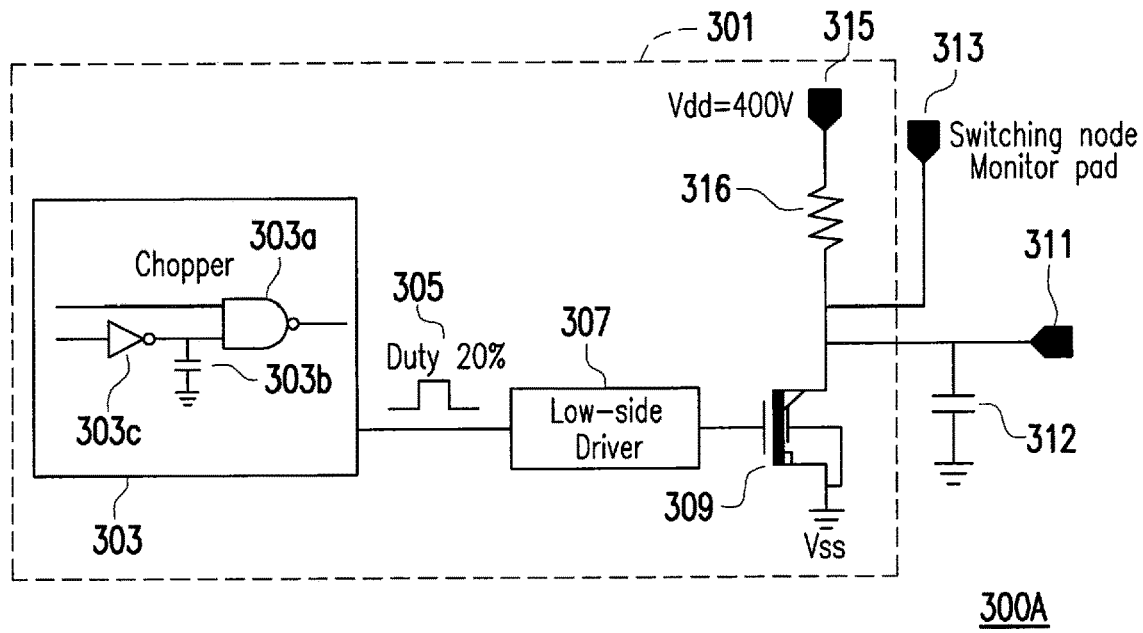
FIG. 3A illustrates an example of a built-in self-test circuit formed on a semiconductor wafer for a power amplification stage that employs a single low side GaN FET, in accordance with some embodiments of the present disclosure.

FIG. 3A illustrates an example of a built-in self-test circuit 300A formed on a semiconductor wafer for a power amplification stage that employs only a single low side GaN FET switch 309. Similar to the built-in self-test circuit 200A, the built-in self-test circuit 300A with the single low side GaN FET may include a driver circuit 303 comprising a chopper circuit that is configured to provide a drive signal 305 with various duty cycles. In various embodiments, the drive signal 305 may have a duty cycle in the range of 15% to 30% (e.g., 20%). In one embodiment, the duty cycle and frequency of the pulses generated by the chopper circuit can be designed based on HTOL testing requirements or any application-relevant device reliability specification. In some embodiments, the built-in self-test circuit 300A may be formed on the same semiconductor wafer 301 as the GaN FET switch 309. For example, transistors and the capacitors within the programmable driver circuit 303 as well as transistors within the low side driver 307 and the GaN FET switch 309 may be patterned on the same semiconductor device layer during the front-end-of-line (FEOL) process. Furthermore, interconnections coupling the driver circuit 303 to the low side drivers 307 and, subsequently, the low side drivers 307 to the GaN FET switch 309 may be patterned on the same metallization layer during the back-end-of-line (BEOL) process. One exemplary advantage of the built-in self-test circuit 300A compared to the built-in self-test circuit 200A is that its implementation may result in reduced chip area. For example, in some implementations of the built-in self-test circuit 300A, the chip area may be reduced by 30%.

In some embodiments, similar to the built-in self-test circuit depicted in FIG. 2A, the built-in self-test circuit 300A may be implemented on a chip with the automatically programmable driver circuit 303 and a low-side driver 307. As shown FIG. 3A, in some embodiments, the chopper circuit of the driver circuit 303 includes a NAND gate 303$a$ having a first input coupled to receive a timing reference signal (e.g., a square wave with 50% duty cycle) from a clock generator (not shown). A second input of the NAND gate 303$a$ is coupled to an output of one or more inverters 303$c$, which has an input coupled to receive the above mentioned timing reference signal from the same clock generator. The second input of the NAND gate 303$a$ is further coupled to a first end of a first capacitor 303$b$ having a second end coupled to ground. In some embodiments, the first capacitor 303$b$ may be used to filter a high frequency noise generated by the clock generator. The output of the NAND gate 303$a$ is a PWM drive signal having a desired duty cycle, which may be used to generate the drive signal 305. Moreover, as shown in FIG. 3A, a drain of the GaN switch 309 may be coupled to a voltage source VDD 315 and a source of the GaN switch 309 may be coupled to a source reference voltage VSS. In some embodiments, the voltage source VDD 315 may be set to about 400V. In some approaches, VSS and GND may be connected to minimize switching noise effects.

Furthermore, the built-in self-test circuit 300A may include monitoring pads 313 and 311 configured to measure a dynamic on-state resistance ($R_{dson}$). As such, the monitoring pads 313 and 311 may measure the voltage across a resistor 316 that is coupled to the voltage source VDD 315 and the drain of the GaN switch 309. Subsequently, the measured voltage across the resistor 316 may be used to determine the dynamic on-state resistance of the GaN switch 309. In some embodiments, an additional monitoring pads may be installed at the gate, source, and drain of the GaN FET switch 309. In various embodiments, a capacitor 312 coupled to the drain of the GaN switch 309 and ground may filter a high frequency measurement noise.

Figure 3B:
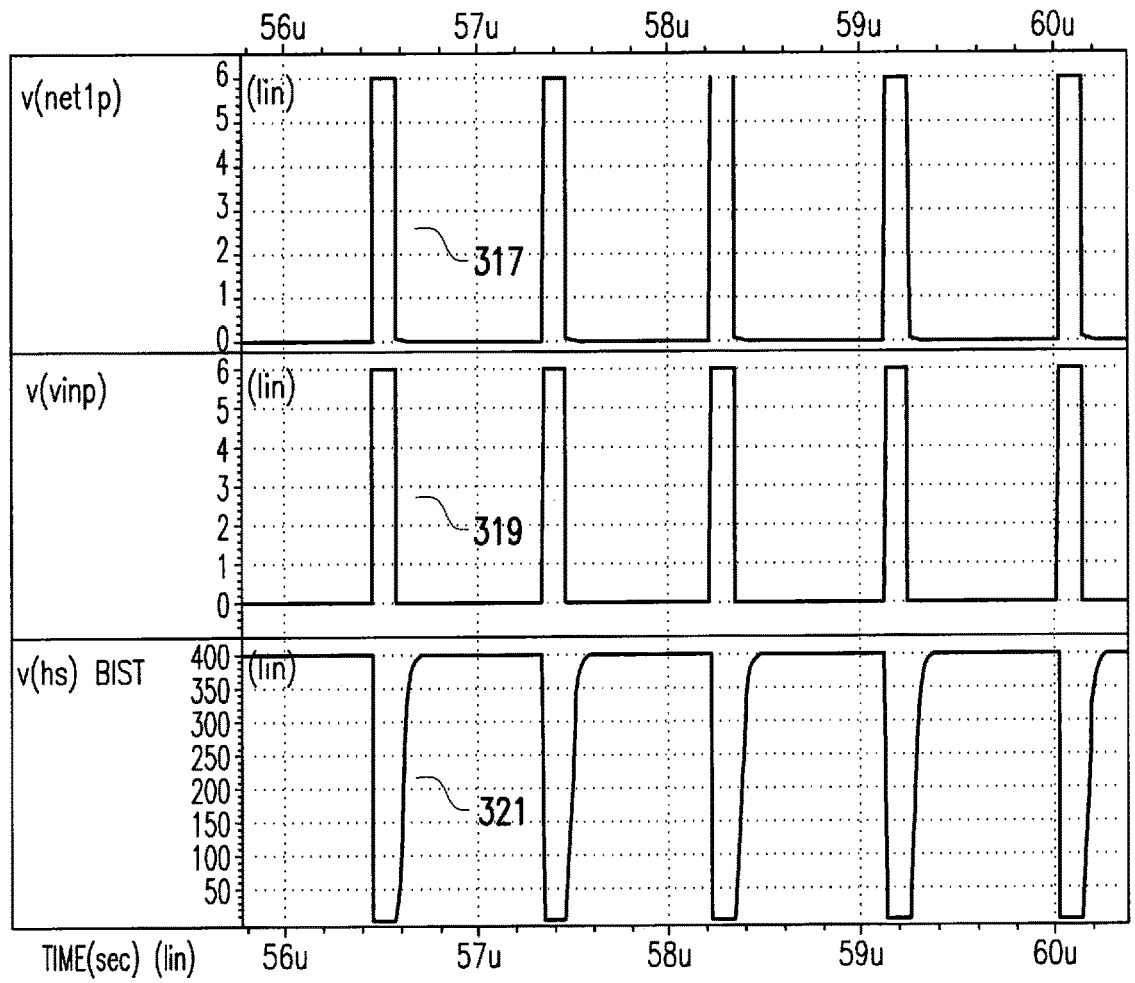
FIG. 3B illustrates a timing diagram showing operating conditions of the built-in self-test circuit of FIG. 3A, in accordance with some embodiments.

FIG. 3B illustrates a timing diagram showing operating conditions of the built-in self-test circuit of FIG. 3A. In some embodiments, the low-side driver 307 may be driven by a pulse width modulated waveform 317. Subsequently, a pulse width modulated waveform 319 may be provided to the gate of the low side GaN FET switch 309. At the monitoring pads 313 and 311, an output waveform 321, similar to the output waveform 235 discussed above, may be observed.

Figure 4A:
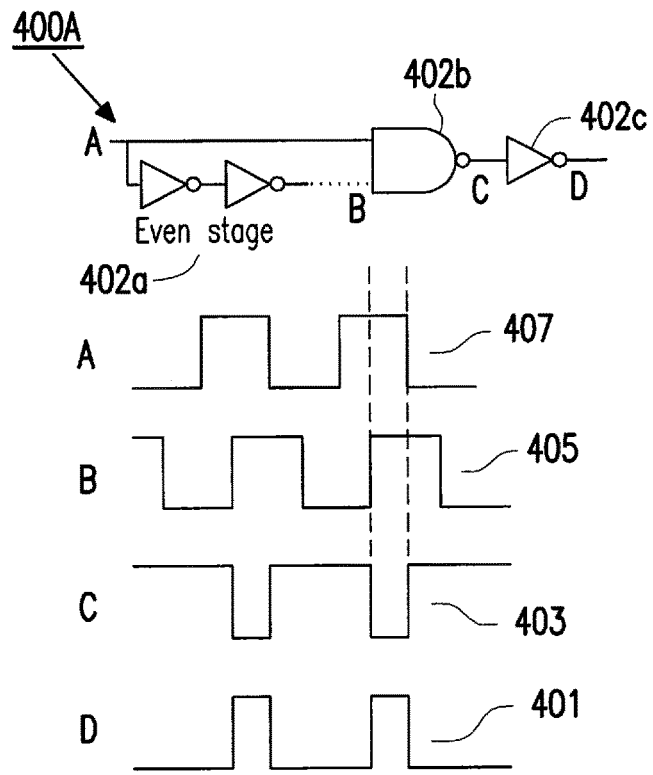
FIG. 4A illustrates a block and operational diagram of a chopper circuit, in accordance with some embodiments.

FIG. 4A illustrates a circuit and operational diagram of a chopper 400A, in accordance with some embodiments. In some embodiments, the chopper 400A, may include a NAND gate 402$a$ having a first input coupled to a clock source and a second input coupled to a string of inverters 402$b$. An output of the NAND gate 402$a$ is coupled to an input of an output inverter 402$c$. In some embodiments, the chopper 400A may implement a delay line with an even number of inverter gates 402$b$. Moreover, the output invertor 402$c$ may be used to implement logical negation (i.e., the output of the invertor gate 402$c$ represents the opposite logic-level to its input). In some embodiments, the chopper 400A may be implemented on a chip within the driver circuit 202. In various embodiments, the chopper 400A may be implemented using Source Couple Logic (SCL) technique, which provides a lower sensitivity to process variations. In some embodiments, the chopper 400A may be implemented on the same die as the GaN bidirectional switches 219 and 217.

The operation of the chopper 400A will now be explained with reference to FIG. 4A. In some embodiments, a duty cycle of a PWM signal 401 generated by the chopper 400A is determined by the phase difference between a first pulse 407 provided at the first input of the NAND gate 402$b$ and a second pulse 405 provided at the second input of the NAND gate 402$b$. In some embodiments, the second pulse 405 is a delayed version of the first pulse 407. For example, a large phase difference between the first pulse 407 and the second pulse 405 may result in a PWM signal with a small duty cycle. More specifically, when the first pulse 407, supplied to a first input of the NAND gate 402$b$, is high and the second pulse 405 is high, the output of the NAND gate 402$b$ is low. On the other hand, when the second pulse 405 is low while the first pulse 407 is high, the output of the NAND gate 402b is low. In this regard, the NAND gate 402b compares the input pulses 407 and 405 and outputs a difference pulse 403. In some embodiment, the invertor 402c may be used to generate the PWM signal 401, which is a logical complement of the difference pulse 403 delayed by a propagation time through the output inventor 402c. In some embodiments, the delay provided by the string of invertors 402a, and hence the duty cycle of the PWM signal 401, can be programmable by programmably coupling a desired number of invertors 402a in series to the second output of the NAND gate 402b. Similarly, the delay provided by the one or more invertors 202e of FIG. 2A, and hence the duty cycle of the PWM signal 205, can be programmable by programmably coupling a desired number of invertors 2023 in series to the second output of the NOR gate 202b, as shown in FIG. 2A.

Figure 4B:
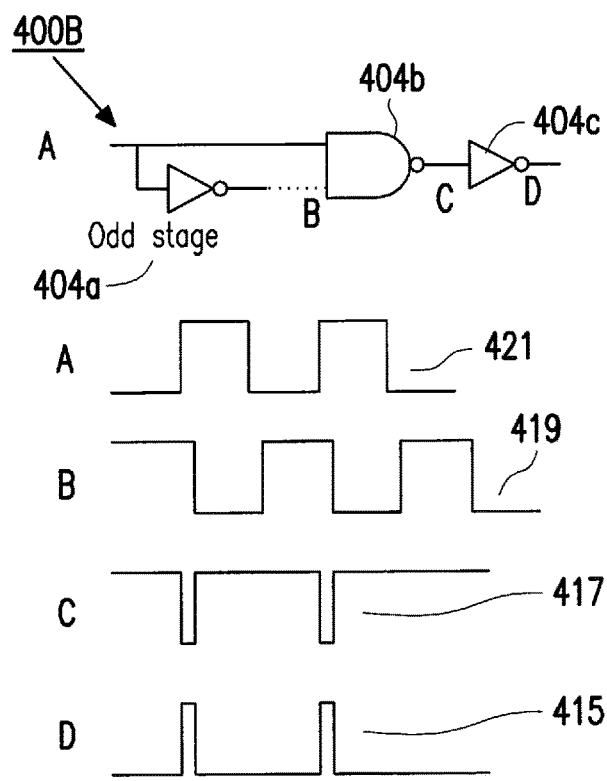
FIG. 4B illustrates a block and operational diagram of a pulse generating circuitry, in accordance with some embodiments.

FIG. 4B illustrates a circuit and operational diagram of a pulse generator 400B, in accordance with some embodiments. As shown in FIG. 4B, the pulse generator 400B may be implemented using a delay line and a NAND gate 404b similar to the structures described above with respect to FIG. 4A. In some embodiments, the delay line includes an odd number of inverter gates 404d. In other embodiments, the delay line includes an even number of inverter gates 404d. Moreover, an output invertor gate 404c, connected in series with the NAND gate 404b, may be used to implement logical negation. In some embodiments, the pulse generator 400B may be implemented on a chip within the driver circuit 202. In various embodiments, the pulse generator 400B may be implemented using Source Couple Logic (SCL) technique, which provides a lower sensitivity to process variations. In some embodiments, the pulse generator 400B may be implemented on the same die as the GaN bidirectional switches 219 and 217. In some embodiments, the output of the pulse generator 400B is a narrow pulse 415 having a duty cycle of 20% or less.

In operation, the pulse generator 400B is configured to compare two pulses 421 and 419, one delayed to another and thereafter generates a pulse 417 which indicates an amount of time difference between the temporally adjacent rising and falling edges of pulses 421 and 419, as shown in FIG. 4B. For example, the pulse generator 400B may compare the original pulse 421 and its delayed version 419, using the NAND gate 404b and output the difference pulse 417. In some embodiment, the invertor gate 404c may be used to generate an output pulse signal 415, which is a logical complement of the difference pulse 417 delayed by a propagation time through the invertor 404c. In some embodiments, the delay provided by the delay line 404d, and hence the duty cycle of the PWM signal 417, can be programmable by programmably coupling a desired number of invertors 404d in series to the second output of the NAND gate 404b.

In some embodiment, the PWM 401 and pulse 415 signals may be used to drive the GaN FET switches under the reliability tests, as discussed above. In particular, the PWM 401 and pulse 415 signals with various duty cycles and pulse widths may be used to evaluate potential reliability issues over the operational lifetime of the GaN FET switches.

Figure 5:
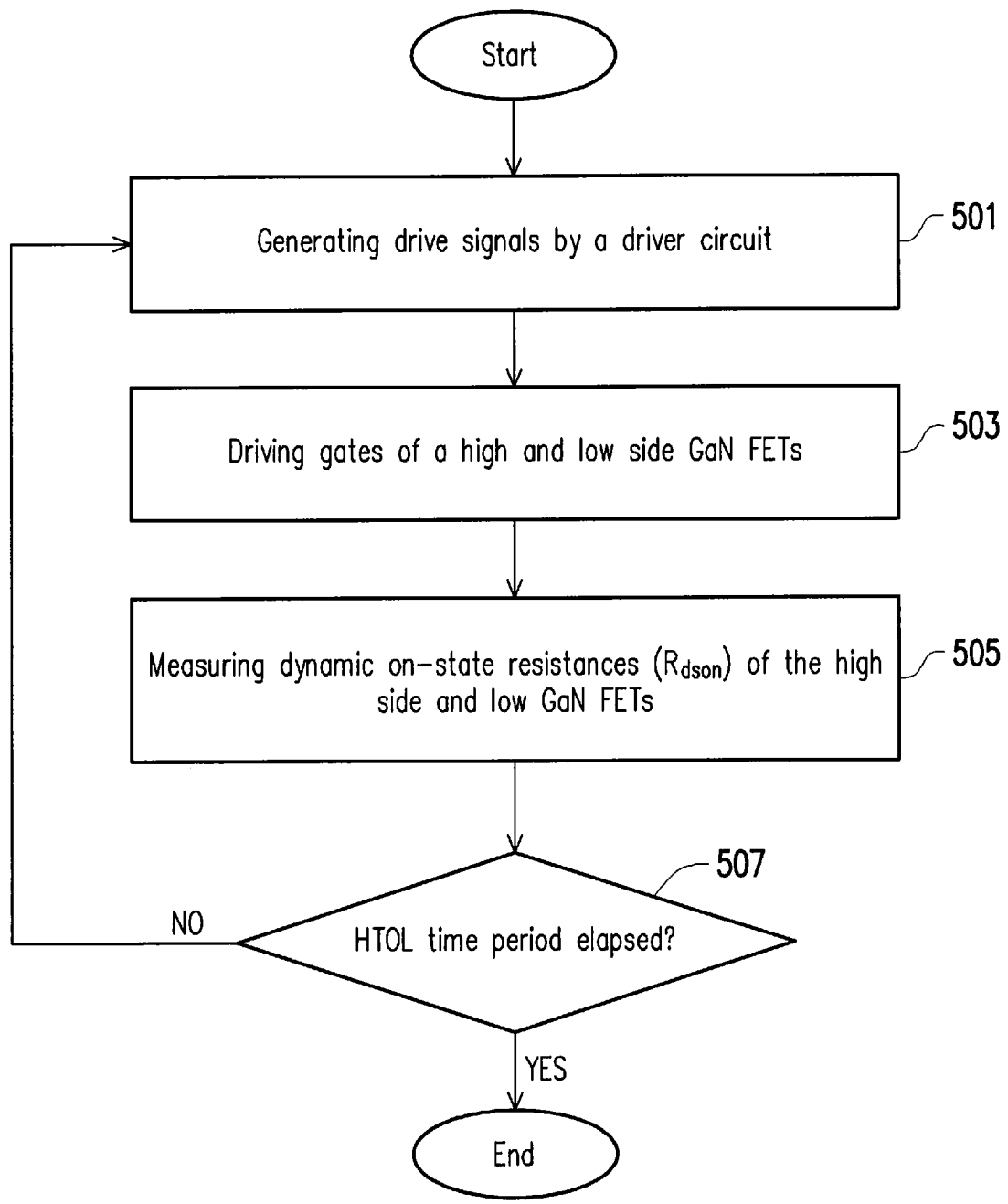
FIG. 5 illustrates a flow chart of a method for reliability testing one or more GaN FETs, in accordance with some embodiments.

FIG. 5 illustrates a flow chart of a method for reliability testing one or more GaN FETs, in accordance with some embodiments. For example, the flow chart of FIG. 5 illustrates operations of HTOL stress testing. As such, at operation 501 drive signals are generated by the driver circuit 202 of FIG. 2A. Next, at operation 503, the drive signals drive gates of the high and low side GaN FETs 217 and 219. Subsequently, at operation 505, dynamic on-state resistances ($R_{dson}$) of the high and low side GaN FETs are measured via one or more monitoring pads. Moreover, at operation 507, if a predetermined HTOL stress testing time period has not yet expired, operations 501, 503, and 505 are repeated for the subsequent drive signals generated by the drive circuit 202. If predetermined HTOL stress testing time period has expired (step 507 of FIG. 5), the operations of the HTOL stress testing ends. In some embodiments, the predetermined HTOL stress testing time period may be based on the life expectancy of the GaN FETs under test. Furthermore, HTOL reliability testing apparatus may receive operational parameters such as the duty cycle of the drive signals or the HTOL stress testing time period. In various embodiments, the operational parameters may be based on High Temperature Operation Life (HTOL) testing requirements, which are specified for each failure mechanisms of GaN FETs under test.

In various embodiments, the HTOL stress testing operations shown in FIG. 5 ages the GaN FET devices under test such that an operational lifetime of the GaN FET devices may be predicted. For example, a 1,000 HTOL hours may predict a minimum of "X" years of operation.

In some embodiments, temperature operational life testing may be used to determine the failure time or operational lifetime of the devices under test. For example, a relationship between the between junction temperatures of the GaN FETs and their corresponding dynamic on-state resistances may be used to determine an operational lifetime of the GaN FETs under test. More specifically, the measured relationship between a multiple junction temperatures and the corresponding dynamic on-state resistances of the GaN FETs under test may predict the operational lifetimes for junction temperatures that were not tested. In this regard, extrapolation methods may be utilized to predict the operational lifetimes for the temperatures ranges or points that were not covered during the HTOL tests.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein; for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A reliability testing apparatus for stacked test gallium nitride field effect transistors (GaN FET) comprising:
   a high side GaN FET test structure;
   a low side GaN FET test structure;
   a high side driver coupled to a gate of the high side GaN FET test structure;
   a low side driver coupled to a gate of the low side GaN FET test structure;
   an integrated driver circuit coupled to the high side and low side drivers and configured to generate drive signals capable of driving the high and low side GaN FET test structures,
   wherein the high and low side GaN FET test structures are connected to a plurality of monitoring pads and
   wherein the high and low side GaN FET test structures, the high and low side drivers, and the integrated driver circuit are all fabricated on a same semiconductor device layer during a front-end-of-line (FEOL) process.

2. The apparatus of claim 1, wherein the integrated driver circuit comprises an integrated chopper circuit and an integrated pulse generator circuit configured to generate the drive signals.

3. The apparatus of claim 2, wherein the drive signals are pulse width modulated signals with predetermined duty cycles.

4. The apparatus of claim 1, wherein the integrated driver circuit is further configured to set duty cycles of the drive signals based on testing parameters of the high and low side GaN FET test structures.

5. The apparatus of claim 4, wherein the testing parameters for configuring the duty cycles of the integrated driver circuit are based on High Temperature Operation Life (HTOL) testing requirements.

6. The apparatus of claim 1 further comprises a voltage level shifter (VLS) coupled to an input of the high side driver.

7. The apparatus of claim 1, wherein the plurality of monitoring pads are configured to measure dynamic on-state resistances ($R_{dson}$) of the high and low side GaN FET test structures.

8. The apparatus of claim 7, wherein the plurality of monitoring pads are installed at a drain, a source, and a gate of the high side GaN FET test structure.

9. A built-in self-test circuit for testing reliability of gallium nitride field effect transistors (GaN FET) comprising:
   a GaN FET test switch;

a driver circuit coupled to a gate of the GaN FET test switch;

an integrated chopper circuit coupled to the driver circuit and configured to generate a drive signal capable of driving the GaN FET test switch, wherein the GaN FET test switch is connected to a plurality of monitoring pads and wherein the GaN FET test switch, the driver circuit, and the integrated chopper circuit are all fabricated on a same device semiconductor layer during a front-end-of-line (FEOL) process.

10. The built-in self-test circuit of claim 9, wherein the drive signal is a pulse width modulated signal with a predetermined duty cycle.

11. The built-in self-test circuit of claim 9, wherein the integrated chopper circuit is further configured to set the duty cycle of the drive signal based on a testing parameter.

12. The built-in self-test circuit of claim 11, wherein the testing parameter for configuring the duty cycles of the integrated chopper circuit is based on High Temperature Operation Life (HTOL) testing requirements.

13. The built-in self-test circuit of claim 9, wherein the plurality of monitoring pads are configured to measure a dynamic on-state resistance ($R_{dson}$) of the GaN FET test switch.

14. The built-in self-test circuit of claim 9, the integrated chopper circuit comprises a delay line based on an even number of inverter gates and a comparator.

15. A method for reliability testing gallium nitride field effect transistors (GaN FETs), the method comprising:

generating drive signals by an integrated driver circuit;

driving gates of a high and low side GaN FET test structures by a high and low side drivers, respectively, wherein the high and low side GaN FET test structures are connected to a plurality of monitoring pads and wherein the high and low side drivers receive the drive signals from the integrated driver circuit;

fabricating the high and low side GaN FET test structures, the high and low side drivers, and the integrated driver circuit on a same device semiconductor layer during a front-end-of-line (FEOL) process; and measuring dynamic on-state resistances ($R_{dson}$) of the high and low side GaN FET test structures by measuring drain to source voltages of the high side and low side GaN FET test structures using the plurality of monitoring pads coupled to a source of the high side GaN FET test structure and a drain of the low side GaN FET test structure.

16. The method of claim 15, wherein the drive signals are pulse width modulated signals.

17. The method of claim 16 further comprising:

determining duty cycles of the pulse width modulated drive signals based on testing parameters.

18. The method of claim 17 further comprising receiving the testing parameters in the integrated driver circuit, wherein the testing parameters are based on High Temperature Operation Life (HTOL) testing requirements.

19. The method of claim 15 further comprising:

sensing a relationship between junction temperatures of the high side and low side GaN FET test structures and the corresponding dynamic on-state resistances.

20. The method of claim 19 further comprising:

determining an operational lifetime of the high side and low GaN FET test structures based on the relationship between the junction temperatures and the corresponding dynamic on-state resistances.

* * * * *